United States Patent [19]
Madaffari

[11] Patent Number: 6,023,194
[45] Date of Patent: Feb. 8, 2000

[54] AMPLIFIER WITH REDUCED INPUT CAPACITANCE

[75] Inventor: Peter L. Madaffari, Camden, Me.

[73] Assignee: Tibbetts Industries, Inc., Camden, Me.

[21] Appl. No.: 08/862,500

[22] Filed: May 23, 1997

[51] Int. Cl.$^7$ ..................................................... H03F 3/16
[52] U.S. Cl. ........................................... 330/277; 330/310
[58] Field of Search ..................... 330/277, 310, 330/300, 296

[56] References Cited

U.S. PATENT DOCUMENTS

| | | | |
|---|---|---|---|
| 3,512,100 | 5/1970 | Killion et al. ............................... | 330/38 |
| 3,801,933 | 4/1974 | Teare ........................................ | 330/277 |
| 4,151,480 | 4/1979 | Carlson et al. ........................... | 330/277 |
| 4,509,193 | 4/1985 | Carlson .................................... | 381/113 |
| 5,017,887 | 5/1991 | Gamand .................................... | 330/277 |
| 5,083,095 | 1/1992 | Madaffari ................................. | 330/277 |
| 5,097,224 | 3/1992 | Madaffari et al. ....................... | 330/277 |
| 5,337,011 | 8/1994 | French et al. ............................ | 330/258 |
| 5,589,799 | 12/1996 | Madaffari et al. ...................... | 330/277 |

*Primary Examiner*—Robert Pascal
*Assistant Examiner*—Khanh Van Nguyen
*Attorney, Agent, or Firm*—Lahive & Cockfield, LLP

[57] ABSTRACT

A JFET preamplifier for use with a high impedance transducer, having an inherently capacitive input bias impedance. The capacitance of the input bias impedance is effectively neutralized by capacitively coupling the JFET gate bias circuit to the source electrode of the JFET. The JFET preamplifier is configured as a source follower which reduces any capacitance between the JFET gate and source electrode by the open loop gain of the amplifier. By capacitively coupling the JFET gate bias circuit capacitance to the JFET source electrode, the overall input capacitance of the preamplifier stage is reduced.

11 Claims, 4 Drawing Sheets

AMPLIFIER WITH REDUCED INPUT CAPACITANCE

BACKGROUND OF THE INVENTION

This invention relates generally to audio frequency amplifier circuits used as pre-amplifier stages of microphone transducers. More particularly, the invention relates to circuits employing transconductance devices operating with low voltage supplies and having predominantly capacitive input impedance.

An amplifier for amplifying a signal from a high impedance source, such as an electret or crystal microphone, or other transducers based on piezoelectric principles, requires a high input impedance to avoid impedance mismatches that will attenuate the input signal to the amplifier. The reason for this attenuation is the voltage division that occurs between the transducer's source impedance and the input impedance of the amplifier. Representing the source impedance as $z_s$, the input impedance as $z_{in}$, the voltage source $v_s$, and the input voltage to the amplifier $v_{in}$, the input voltage to the amplifier is given by the known relationship:

$$v_{in} = v_s \frac{z_{in}}{z_{in} + z_s}. \qquad (1)$$

If the impedances are characterized as purely capacitive, as is the case with an electret microphone connected with a transconductance device such as a JFET, equation 1 becomes $$v_{in} = v_s \frac{c_s}{c_s + c_{in}}, \qquad (2)$$

where the transducer capacitance is $c_s$ and the amplifier input capacitance is $c_{in}$. It is obvious from (2) that as $c_{in}$ is made smaller relative to $c_s$, there will be less attenuation of the source voltage $v_s$ at the input to the amplifier, $v_{in}$. This will have the beneficial effect of a larger signal to noise ratio, and a greater output signal.

In hearing-aid technology, the use of electret acoustic transducers is common. An electret acoustic transducer has a very low signal output voltage, a very high output impedance which is predominately capacitive, and a very broad output frequency spectrum. In addition, in hearing-aid technology a single cell low voltage power supply is used for amplification purposes. The use of a single cell low voltage power supply, typically 1.3 volts or so, means that often the desired signal at the preamplifier input is only slightly higher in voltage than the undesired noise. At the output it is very important that an amplifier be able to make use of the entire available signal voltage in order to achieve a suitable signal-to-noise-ratio. Noise from electronic components and feedback signals from other amplifier stages coupled through the low impedance power source make it imperative that the entire output voltage signal from an electret acoustic transducer be used in order to achieve a suitable signal to noise ratio.

In hearing aid technology it is usual for high input impedance transconductance devices to be used as pre-amplifier stages. These devices are typically used in a follower configuration allowing the output impedance to be at a lower value suitable for following amplifier stages with higher gain and lower input impedance. It is common for FET transistors to be used for this purpose. Various methods have been utilized to achieve this desired result.

Prior art on electret-based condenser microphone preamplifiers most commonly describes circuits in which a single cell is used and the common reference point for input and output is the lower potential rail. This allows the use of N channel junction field effect transistors, generally the quietest of the field effect transistors, for the active element. Although the following description uses circuits with this orientation, it should be understood that the invention is not limited to this orientation, but can equally apply to circuits where the upper rail is the ground reference or where a split supply is used.

Also, the following description is not limited to the JFET sub-class of FETs, but applies to FETs in general. N channel JFETs are, however, the preferred embodiment.

Early electret-based condenser microphones for hearing aid application had transducer elements with 7 to 10 pfd. source capacitance. The amplifier following the microphone would often have a low input impedance, in the kilo-ohm (KΩ) or tens of KΩ range. Because of this mismatch in impedance, it was found necessary to employ a field effect transistor (FET) as a buffer between the transducer and the main amplifier so as to minimize signal loss. For these early electret-based condenser microphones, such a transistor was considered acceptable if it had an input capacitance and transconductance such that signal attenuation at both the input and output was minimal.

For such microphones prior art generally employed a single junction FET (JFET), most commonly a 2N4338 or a manufacture specific equivalent as the transistor and applied it in the source follower mode so as to minimize the effective input capacitance and output impedance. For the follower mode of operation, it is well known that $c_{gs}$, the gate to source capacitance inherent in the transistor, is reduced by the open circuit gain of the stage, which can be made large enough so as to make the effective gate to source capacitance negligible.

In prior art, a very large resistor, often in the GΩ (giga-ohm) range was used for gate bias. Later art such as U.S. Pat. No. 3,512,100 to Killion et al and U.S. Pat. No. 4,151,480 to Carlson et al modified the JFET follower circuitry by the replacement of the gate bias resistor with a parallel pair of opposing polarity diodes. This was done because the real part of the impedance presented by the diodes was much larger than could be normally attained by a passive, screened on, resistive element. In general, the higher the real part of the impedance for the bias element, the lower the noise introduced by the bias element. Resistors screened on ceramic, if properly manufactured, are almost purely resistive elements. Unfortunately, the proper manufacture of giga-ohm (GΩ) sized resistors requires that they be very long compared to low valued resistors. If kept physically short the a.c. impedance, although still resistive may be a small fraction of the d.c. impedance. Apparently there is some capacitive shunting along the length of the resistor, which reduces its effective impedance without adding a capacitive term to impedance measured across the terminals. Diodes, on the other hand, are formed by the junction of two semiconductor materials of opposing polarity and inherently form a capacitive element as part of their structure. This capacitance is effectively a parallel element to the "ideal" diode. As $c_{gd}$, the gate to drain capacitance of the JFET, is inherent in the gate to drain diode junction of the JFET, it is not surprising that the junction capacitance of the diode pair can be of a similar magnitude as $c_{gd}$. Therefore, as shown by equation (2), for the case where the junction capacitance of the diode pair equals $c_{gd}$, the signal would be attenuated by about 6 dB more than if the diodes were not present. The use of the diodes has other limitations. As the voltage across a forward biased diode increases, the impedance of the diode decreases, dropping many orders of magnitude until it may be as low as hundreds of ohms. Signal distortion will then occur as the impedance changes. For some applications, studio microphones for example, very high signal levels may be common at times, and such distortion is then a problem. Prior art such as Madaffari et al U.S. Pat. No. 5,097,224 teaches that a GΩ resistor in series with the diodes will overcome the overload problem, because even when the diodes drop to a low a.c. impedance, the GΩ resistor will have a high enough impedance compared to the source impedance that distortion will not occur.

U.S. Pat. No. 5,083,095 issued on Jan. 21, 1992 to Madaffari discloses an amplifier utilizing multiple source follower amplifiers. These amplifiers exhibit an improved input impedance; however, the amplifiers of that patent suffer from a reduction in DC operating range making it difficult to operate the amplifiers with low voltage and especially single cell power supplies, with the attendant difficulties described above.

U.S. Pat. No. 5,337,011 issued on Aug. 9, 1994 to French et al., discloses an amplifier utilizing a multiple source follower amplifier with a bias network which includes a pair of oppositely oriented, parallel connected diodes in the bias network. In addition to the reduced DC operating range discussed above, there is no manner of dealing with the junction capacitances of the diode biasing network. This additional capacitance will lead to attenuation of the input signal to the amplifier as described in equations (1) and (2) above.

SUMMARY OF THE INVENTION

It is a principal object of the invention to provide means to reduce the effect of the capacitance $c_{gs}$ of the transistor together with the capacitance of the bias network on the amplifier's input impedance.

A second and related object of the invention is to provide means to control the extent of the reduction in the effect of said capacitance as a function of the desired frequency response characteristic of the amplifier.

Other objects of the invention will be evident from the requirements of specific circuit embodiments as hereinafter shown and described.

With the foregoing objects in view, this invention comprises a transconductance device with first, second, and third electrodes, having a high input impedance and low output impedance, and configured as a follower circuit wherein the output voltage is approximately equal in magnitude and phase to the input voltage. The transconductance device has a bias network connected to the first electrode. The bias network comprises a pair of diodes connected in parallel and oppositely polarized and the diodes are connected to the first electrode of the transconductance device and are also in series with a first impedance that is connected to ground. A load impedance is connected between the second electrode of the transconductance device and ground so that an output voltage is developed across it. A capacitor is connected between the series connection of the diodes with the first impedance, and the second terminal of the transconductance device, whereby the capacitance associated with the diodes is essentially connected between the first and second electrodes of the transconductance device, at the frequencies of interest, and the combined capacitance is effectively reduced by a factor substantially equal to the open loop gain of the amplifier.

These and other features, aspects and advantages of the present invention will be better understood with regard to the following description of the invention.

BRIEF DESCRIPTION OF THE DRAWINGS

FIG. 1-A is a schematic diagram of a second previously known JFET amplifier circuit;

In the drawings, like reference characters in the figures representing the several embodiments refer to the same elements or elements performing the same or comparable functions.

DETAILED DESCRIPTION

Figure 1:
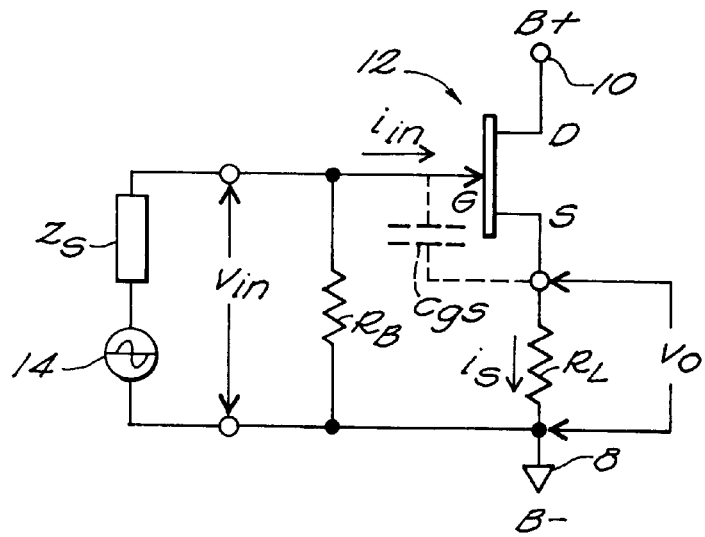
FIG. 1 is a schematic diagram of a first previously known JFET amplifier circuit.
Figure 1A:
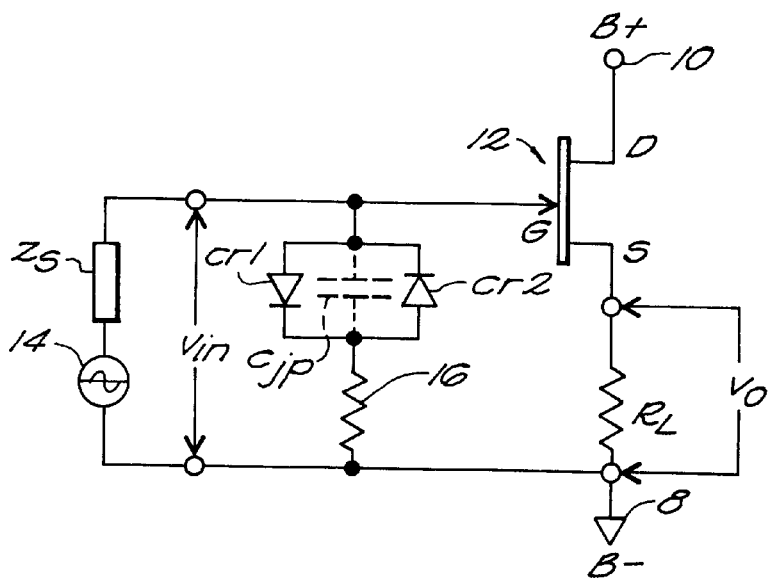

Referring to FIG. 1, a transconductance device 12 is an N channel junction field effect transistor (JFET). As shown in FIG. 1 the JFET 12 is connected in a source follower configuration to a transducer 14, which for purposes of explanation may be an electret transducer of high output impedance. The JFET 12 has an output impedance $R_L$ in the source to ground circuit. The JFET has an inherent gate-to-source capacitance $c_{gs}$. A d.c. power supply [not shown] is connected between a B+ terminal 10 and ground represented by a terminal 8. A gate bias resistor $R_B$ is assumed to be of very high value.

The JFET acts as a voltage controlled current source such that its transconductance $g_m$ is defined as the ratio of the current in the output impedance to the voltage between the gate and source, $v_{gs}$. Thus, $$g_m = \frac{i_s}{v_{gs}} \qquad (3)$$

If the current $i_s$ flows through the load resistor $R_L$ it produces the output voltage $v_o$. Thus, $$v_o = g_m v_{gs} R_L. \qquad (4)$$

The voltage between the gate and the source, $v_{gs}$, may be written as $$v_{gs} = v_{in} - v_o. \qquad (5)$$

The voltage gain of the amplifier may then be derived from equations (4) and (5):

$$\frac{v_o}{v_{in}} = \frac{g_m R_L}{1 + g_m R_L} \qquad (6)$$

It will be apparent that in the case where values of $g_m R_L \gg 1$ the gain of the source follower stage will approach unity.

The input impedance may be defined as:

$$z_{in} = \frac{v_{in}}{i_{in}}. \qquad (7)$$

Substituting from equations (4) and (5) above leads to:

$$z_{in} = \frac{1 + g_m R_L}{sc_{gs}} \approx \frac{g_m R_L}{sc_{gs}} \approx \frac{1}{sc_{gs}/g_m R_L} \quad (8)$$

where s is the Laplacian operator, a function of the frequency. Therefore, it is seen that the input impedance is affected not only by the frequency of the signal, but also by the open loop gain. Equation (8) shows that there is an inverse relationship between $g_m R_L$, defined as the open loop gain, and the gate to source capacitance $c_{gs}$.

When the JFET 12 of FIG. 1 is connected to a transducer 14 such as an electret device which has an essentially capacitive output impedance $z_s$ with respect to a.c. signals, substituting equation (8) into equation (1) results in $$v_{in} = v_s \frac{c_s}{c_s + c_{gs}/g_m R_L} \quad (9)$$

where $c_s$ is the capacitance of the transducer output. Equation (9) shows that as the value of the $c_{gs}$ term decreases relative to that of $c_s$ the gain approaches unity, and that such decrease is produced with increasing values of the open loop gain.

This can be also understood by observing from equation (6) that in a source follower configuration the output signal approaches the same magnitude as the input signal and is in-phase with the input signal with increasing values of the open loop gain. Therefore, since the magnitude and phase of the voltage potentials at both terminals of the source-gate capacitance $c_{gs}$ are the same, the capacitance has been effectively neutralized.

FIG. 1-A shows a JFET source follower amplifier in which the single bias resistor is replaced by two oppositely polarized diodes cr1 and cr2 connected in parallel and in series with a resistor 16. The diodes have an impedance of which the real part is much larger than could be obtained by a passive resistor. Diodes, as is well known in the art, are formed by the junction of two semiconductor materials of opposite polarity and form a capacitive element $c_{jp}$ as an inherent part of their structure, shown by broken lines in the drawing. The value of this capacitor is significant in relation to that of the gate-drain capacitance, $c_{gd}$. Since this added capacitance increases the size of the denominator in equation (2), it results in attenuating the input voltage signal. In practice, if $c_{jp}$ is approximately equal to $c_{gd}$ there will be a signal attenuation of as much as 6 dB.

Figure 2:
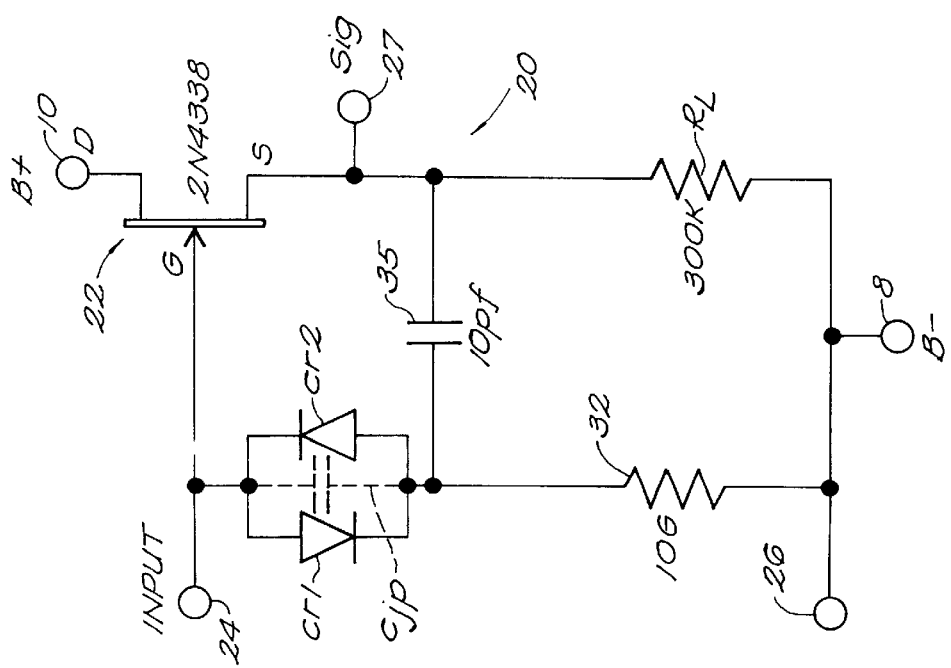
FIG. 2 is a schematic diagram of a first embodiment of the present invention.

Turning now to FIG. 2 which discloses a first embodiment of the present invention, an amplifier designated generally at 20 is provided with input terminals 24, 26 for connection to an electro-acoustic transducer, for example an electret based condenser microphone. The terminal 26 is connected to the ground rail 8. The output is taken between a terminal 27 and the ground rail 8.

The circuit generally comprises a first JFET 22, connected in follower mode. The gate, source and drain terminals are labeled "G", "S", and "D," respectively. The pre-amplifier 20 has a bias network comprising two parallel connected, oppositely polarized diodes cr1, cr2, in series with a resistor 32. The bias network is connected between the G electrode of the first JFET 22, and ground 8. The load impedance $R_L$ is connected between the source of the first JFET 22, and ground 8. A capacitor 35 is connected between the S electrode of the first JFET 22 and the series connection between the diodes and the resistor 32. A power supply (not shown), typically a single cell supply of low voltage, supplies current between the ground 8 and the connector 10. A drain impedance [not shown] optionally may be placed in series between the D electrode of the first JFET 22 and the connector 10.

A characteristic of the present invention is that the capacitor 35 provides a signal path, in the frequency range of interest, that will ensure that the signals at each terminal of the diodes' junction capacitance $c_{jp}$ will be of equal magnitude and phase, thus neutralizing the junction capacitance of the diodes. That is, the capacitor 35, in the frequency range of interest, provides a low impedance signal path connecting the junction capacitance of the diodes in parallel to $c_{gs}$, when compared to the impedance of the resistor 32. Thus the effectively parallel capacitors $c_{gs}$ and $c_{jp}$ are reduced and neutralized by the open loop gain as shown by equation (9). In the preferred embodiment the capacitor 35 is much larger than the junction capacitance of the diodes.

It would be obvious to one skilled in the art to utilize a source capacitor [not shown] in parallel with the load impedance $R_L$ to adjust the frequency response of the pre-amplifier. It is well known that a source capacitor may be chosen to shape the frequency response of the amplifier in conjunction with the load impedance. This occurs by providing a low impedance path to ground for unwanted signals above a cutoff frequency. Above this corner frequency the amplifier response is reduced at approximately 6 dB per octave. For example, by having a cutoff frequency coincide with the approximate corner frequency of the human ear, a decrease in the total acoustic noise is achieved since higher frequencies are attenuated, and the amplifier has a reduced chance of overload. Such a source capacitor, by providing a direct path to ground at and above the cutoff frequency, effectively connects the capacitor 35 to ground and functionally eliminates the neutralization circuit at those frequencies. This is not a problem, however, since the neutralization is desired only for the frequencies of interest, and signals above the cutoff frequency where the neutralization effect is eliminated are not signals of interest.

Figure 3:
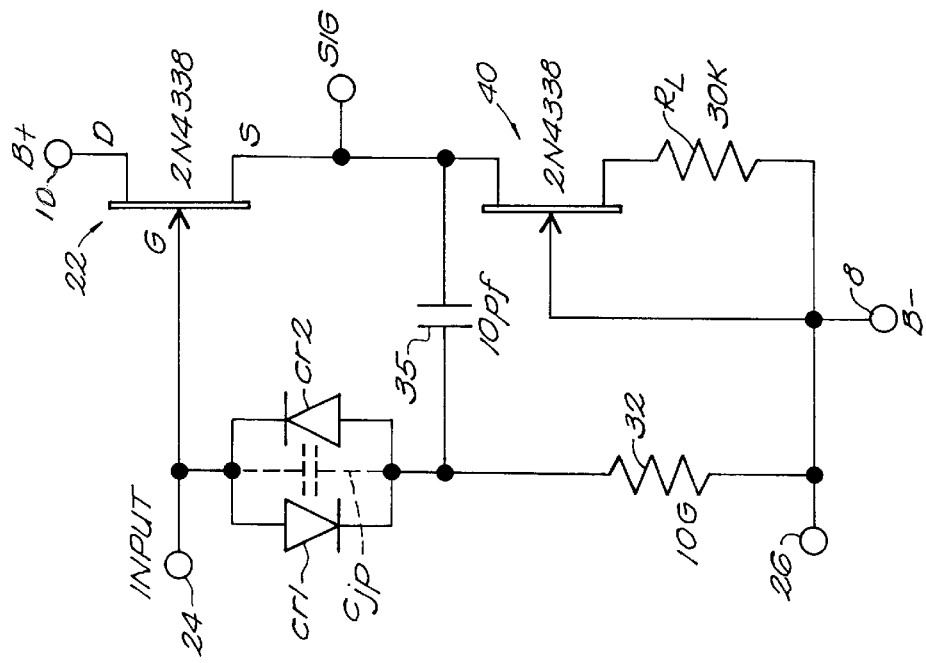
FIG. 3 is a schematic diagram of a second embodiment of the present invention.

Turning now to FIG. 3, this is the same circuit as in FIG. 2 except that the load impedance $R_L$ is replaced by a second JFET 40 connected as an active load current source, as described in U.S. Pat. No. 5,589,799 to Madaffari et al. The capacitor 35 serves the same function as in FIG. 2. It is also obvious to place a source capacitor [not shown] parallel to the current source, that is connected between the source S of the JFET 22 and ground 8, to shape the frequency response as described above.

Figure 4:
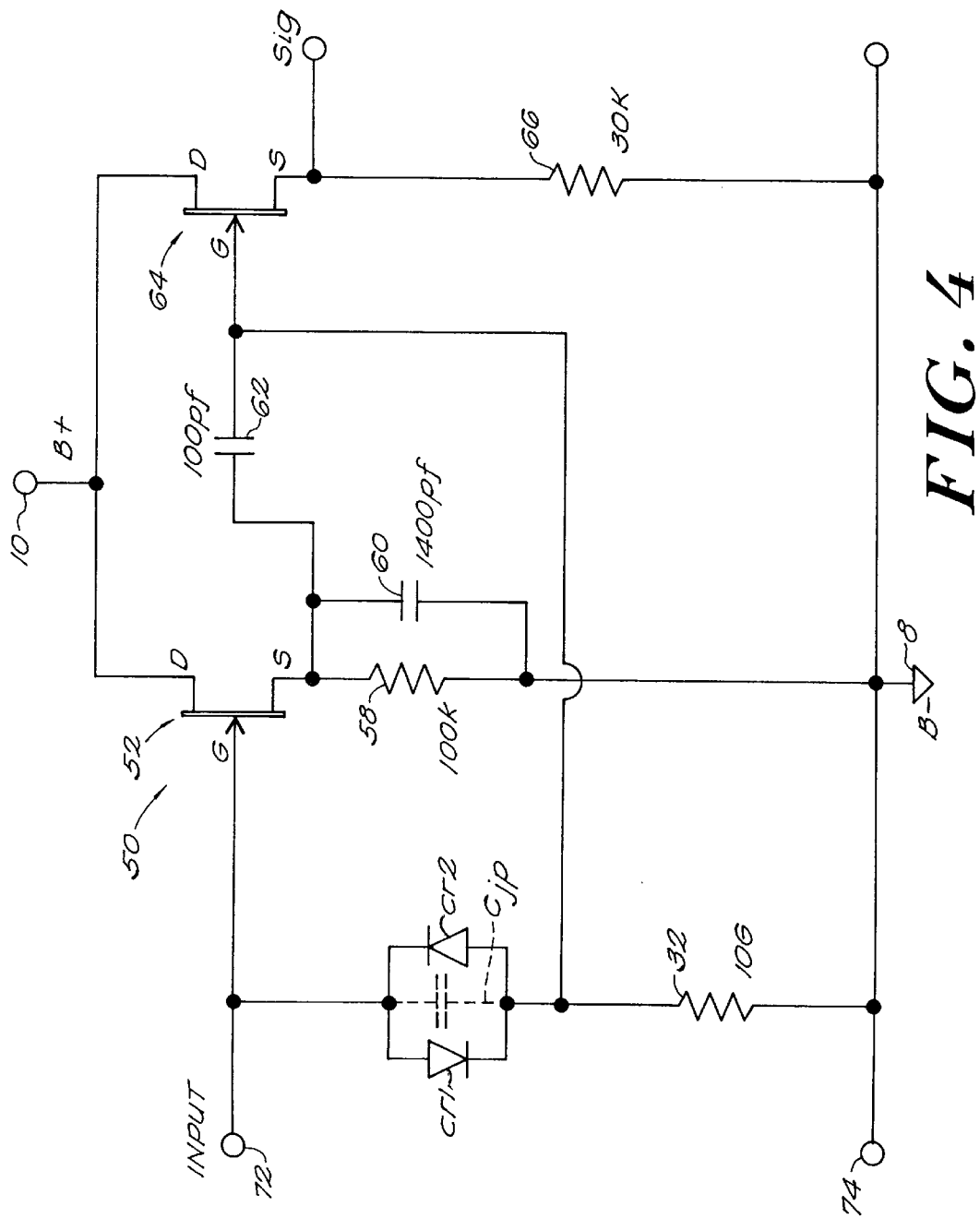
FIG. 4 is a schematic diagram of a third embodiment of the present invention.

Turning now to FIG. 4, there is described a pre-amplifier 50 which is provided with input terminals 72 and 74 for connection to an input source, which in the preferred embodiment is an electret based condenser microphone. The terminal 74 is connected to the ground rail 8.

The circuit generally comprises a first JFET 52 configured as a source follower, and a second JFET 64 also configured as a source follower. Each JFET 52 and 64 has terminals labeled "G", "S," "D." The input terminal 72 is connected to the G electrode of the first JFET 52. The amplifier 50 has a bias network comprising two parallel connected, oppositely polarized diodes cr1, cr2 connected to the G electrode of the first JFET 52 and connected in series with the impedance 32 which is connected to ground rail 8. A first load impedance 58 is connected between the S electrode of the first JFET 52 and ground, and a first source capacitor 60 is connected in parallel with the first load impedance for frequency shaping. A capacitor 62 is connected to the first JFET 52 S electrode and to both the G electrode of the second JFET 64 and the series connection between the diodes cr1 and cr2 and the impedance 32. The D electrodes of the first and second JFETs 52 and 64 are connected to the rail 10. A power source [not shown] is connected between the rail 10 and the ground rail 8. A second load impedance 66 is connected between the S electrode of the second JFET 64 and the ground rail 8.

In addition to its function of a.c. coupling and d.c. isolation between the pre-amplifier stages, the capacitor 62 provides the same function as the capacitor 35 in FIGS. 2 and 3. That is, it provides a signal path which establishes voltage potentials of equal amplitude and phase at each terminal of the junction capacitance of the diodes, thus effectively neutralizing them.

It will be obvious that under certain design conditions a drain impedance [not shown] could be inserted in series between the D electrode of either, or both, the first and second JFETs 52 and 64 and the rail 10. In addition, it would be obvious to one of ordinary skill in the art that a second source capacitor can be used in parallel with the second load impedance 66 to further shape the frequency response of the amplifier.

Figure 5:
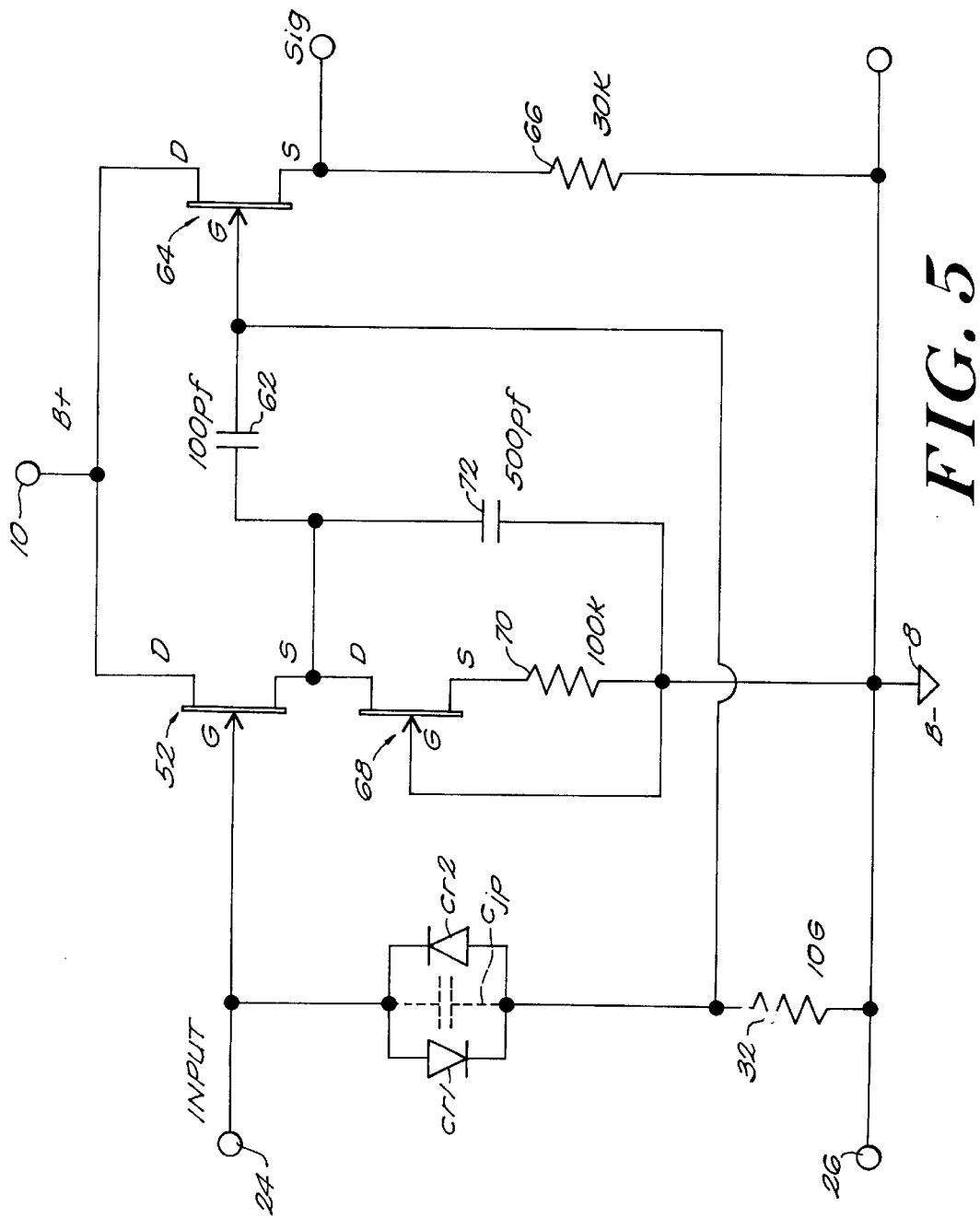
FIG. 5 is a schematic diagram of a fourth embodiment of the present invention.

Turning now to FIG. 5, it may be seen that this is essentially the same circuit as FIG. 4 except that the first load impedance 58 is replaced in function by a third JFET 68 and source impedance 70 connected as an active load current source. The G electrode of the third JFET 68 is connected to the ground rail 8, the D electrode of the third JFET 68 is connected to the S electrode of the first JFET, and the source impedance 70 is connected between the S electrode of the third JFET 68 and the ground rail 8. The third JFET 68 performs the same function as the JFET 40 of FIG. 3, and a first source capacitor 72 is connected and performs the same function as the shaping capacitor 60.

Under certain design conditions, a drain impedance [not shown] can be inserted in series between the D electrode of either, or both, the first and second JFETs 52 and 64 and the connector 10. In addition, it would be obvious that a source capacitor [not shown] can be used in parallel with the second load impedance 66 to further shape the frequency response of the amplifier.

In the circuits of FIGS. 4 and 5, the resistor 32 functions to provide bias for the gate electrodes of both of the JFETs 52 and 64.

I claim:

1. A preamplifier for a predetermined operative frequency range comprising, in combination,
   a first transistor having gate, drain and source electrodes,
   a first load impedance having a first terminal connected to the source electrode,
   a d.c. supply having a circuit connected to pass current between the drain and source electrodes and through the first load impedance,
   a pair of input terminals respectively connected to the gate electrode and a second terminal of the first load impedance,
   a bias network comprising a capacitive element having a first terminal connected to the gate electrode and a resistance connected between the second terminals of the capacitive element and first load impedance, and
   a capacitor completing a circuit between the source electrode and the second terminal of said capacitive element, and being of sufficient magnitude to substantially equalize the amplitudes and phases of the a.c. potentials at both said terminals of the capacitive element at frequencies within said range.

2. A preamplifier according to claim 1, in which the capacitive element comprises a pair of oppositely polarized junction diodes connected in parallel.

3. A preamplifier according to claim 1, in which the first load impedance comprises a resistor.

4. A preamplifier according to claim 1, including a source impedance and a second transistor having a drain electrode connected to the source electrode of the first transistor, a source electrode connected to a first terminal of the source impedance, and a gate electrode connected to a second terminal of the source impedance and said second terminal of the first load impedance.

5. A preamplifier according to claim 1, in which the first transistor comprises a field effect transistor.

6. A preamplifier according to claim 5, in which the first transistor comprises an N channel junction field effect transistor.

7. A preamplifier according to claim 1, in which the d.c. supply comprises a battery having terminals with circuit connections to the drain electrode of the first transistor and the second terminal of the first load impedance, respectively.

8. A preamplifier according to claim 1, including
   a third transistor having gate, drain and source electrodes, and
   a second load impedance having a first terminal connected to the last mentioned source electrode, said circuit of the d.c. supply being connected to pass current between the last mentioned drain and source electrodes and through the second load impedance, the last mentioned gate electrode being connected to the second terminal of said capacitive element.

9. A preamplifier according to claim 8, including
   a frequency shaping capacitor connected between the source electrode of the first transistor and the second terminal of the first load impedance.

10. A preamplifier for a predetermined operative frequency range comprising, in combination,
    a first transistor having gate, drain and source electrodes,
    a first load impedance having a first terminal connected to the source electrode,
    a d.c. supply having a circuit connected to pass current between the drain and source electrodes and through the first load impedance,
    a pair of input terminals respectively connected to the gate electrode and a second terminal of the first load impedance,
    a bias network comprising a capacitive element having a first terminal connected to the gate electrode and a resistance connected between the second terminals of the capacitive element and first load impedance,
    a capacitor completing a circuit between the source electrode and the second terminal of said capacitive element, and being of sufficient magnitude to substantially equalize the amplitudes and phases of the a.c. potentials at both said terminals of the capacitive element at frequencies within said range, the first load impedance comprising a source impedance and second transistor having a drain electrode connected to the source electrode of the first transistor, a source electrode connected to a first terminal of the source impedance, and a gate electrode connected to a second terminal of the source impedance and said second terminal of the first load impedance, a third transistor having gate, drain and source electrodes and a second load impedance having a first terminal connected to the last mentioned source electrode, said circuit of the d.c. supply being connected to pass current between the last mentioned drain and source electrodes and through the second load impedance, the last mentioned gate electrode being connected to the second terminal of said capacitive element.

11. A preamplifier according to claim 10, including a frequency shaping capacitor connected between the source electrode of the first transistor and the second terminal of the first load impedance.

* * * * *